United States Patent
Wu et al.

(10) Patent No.: US 11,549,760 B2
(45) Date of Patent: Jan. 10, 2023

(54) HEAT DISSIPATION ASSEMBLY

(71) Applicant: DELTA ELECTRONICS, INC., Taoyuan (TW)

(72) Inventors: Wei-Fang Wu, Taoyuan (TW); Li-Kuang Tan, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 17/646,148

(22) Filed: Dec. 28, 2021

(65) Prior Publication Data

US 2022/0120510 A1    Apr. 21, 2022

Related U.S. Application Data

(60) Division of application No. 16/820,662, filed on Mar. 16, 2020, now Pat. No. 11,236,948, which is a continuation-in-part of application No. 15/336,758, filed on Oct. 27, 2016, now Pat. No. 10,631,435.

(30) Foreign Application Priority Data

Aug. 24, 2016 (CN) .......................... 201610714849.4

(51) Int. Cl.
F28D 15/02 (2006.01)
F28D 15/04 (2006.01)
H05K 7/20 (2006.01)

(52) U.S. Cl.
CPC ......... F28D 15/0266 (2013.01); F28D 15/04 (2013.01); H05K 7/20309 (2013.01); H05K 7/20318 (2013.01); H05K 7/20336 (2013.01); H05K 7/20418 (2013.01)

(58) Field of Classification Search
CPC .... F28D 15/025; F28D 15/0266; F28D 15/04; H05K 7/20336; H05K 7/20309; H05K 7/20418; G11B 33/142
See application file for complete search history.

(56) References Cited

U.S. PATENT DOCUMENTS 5,168,544 A * 12/1992 Kolasa ...................... F41H 9/06
                                                          392/387
6,381,135 B1 * 4/2002 Prasher ................. F28D 15/043
                                                          361/698

(Continued)

FOREIGN PATENT DOCUMENTS

CN      2834120 Y      11/2006
CN      1873360 A      12/2006

(Continued)

OTHER PUBLICATIONS

CN2834120 translation.

*Primary Examiner* — Jon T. Schermerhorn, Jr.
(74) *Attorney, Agent, or Firm* — CKC & Partners Co., LLC (57) ABSTRACT

A heat dissipation assembly includes a condenser, an evaporator, a vapor conduit, and a liquid conduit. The condenser has a condensing chamber therein. Two ends of the vapor conduit are respectively connected to the condenser and the evaporator. Two ends of the liquid conduit are respectively connected to the condenser and the evaporator. A geometric center of the liquid conduit in the condensing chamber is lower than or equal to a geometric center of the condensing chamber.

10 Claims, 10 Drawing Sheets

(56) References Cited

U.S. PATENT DOCUMENTS

| | | | | |
|---|---|---|---|---|
| 6,836,407 B2* | 12/2004 | Faneuf | ............... | H05K 7/20809 |
| | | | | 361/695 |
| 7,246,655 B2* | 7/2007 | Mochizuki | ............ | F28D 15/046 |
| | | | | 165/104.21 |
| 7,431,071 B2* | 10/2008 | Wenger | ................ | F28D 15/043 |
| | | | | 165/47 |
| 7,958,935 B2* | 6/2011 | Bel | ....................... | H01L 23/427 |
| | | | | 165/80.4 |
| 9,273,910 B2 | 3/2016 | Wenger | | |
| 2003/0051859 A1* | 3/2003 | Chesser | ................ | H01L 23/427 |
| | | | | 165/46 |
| 2004/0050533 A1 | 3/2004 | Chesser et al. | | |
| 2015/0129175 A1* | 5/2015 | Huang | .................. | F28D 15/046 |
| | | | | 165/104.21 |
| 2018/0248464 A1* | 8/2018 | Murase | .................. | H02K 55/02 |
| 2019/0339023 A1 | 11/2019 | Huang et al. | | |
| 2020/0124351 A1* | 4/2020 | Wang | .................... | F28D 1/0358 |

FOREIGN PATENT DOCUMENTS

| | | |
|---|---|---|
| CN | 103733746 A | 4/2014 |
| CN | 104040278 A | 9/2014 |
| TW | I289190 B | 11/2007 |
| TW | I339331 B | 3/2011 |

* cited by examiner

HEAT DISSIPATION ASSEMBLY

CROSS-REFERENCE TO RELATED APPLICATION

This application is a Divisional application of the U.S. application Ser. No. 16/820,662, filed Mar. 16, 2020, which is a Continuation-in-part application of U.S. patent application Ser. No. 15/336,758, filed Oct. 27, 2016, now U.S. Pat. No. 10,631,435, issued on Apr. 21, 2020, which claims priority to China Application Serial Number 201610714849.4, filed Aug. 24, 2016, all of which are herein incorporated by reference.

BACKGROUND

Field of Invention

The present invention relates to a heat dissipation assembly. More particularly, the present invention relates to a heat dissipation assembly that has a condenser and an evaporator.

Description of Related Art

When electronic components or semiconductor components of a typical electronic product (or a photoelectric product) are in operation, they usually generate a great amount of thermal energy. To prevent the electronic components or the semiconductor components from overheating so as to damage the electronic components or the semiconductor components, a heat dissipation device is often assembled to the electronic product or the photoelectric product to reduce the working temperatures of the electronic components or the semiconductor components, thereby avoiding the malfunction of the electronic products.

In the case of applying a typical thermal siphon, an evaporator is disposed on a heat source, such that the heat of the heat source may be transferred to water contained in the evaporator. After the water absorbs the thermal energy, the water may undergo phase transformation and evaporation into water vapor. The water vapor may be transmitted to a condenser through a gas phase conduit, where the water vapor is condensed back to water. Subsequently, the water condensed in the condenser may return to the evaporator through a liquid phase conduit. By way of the aforesaid heat exchange circulation, the heat source can be cooled down.

Since a typical siphon heat dissipation device mainly utilizes the principle that the water vapor goes up and the liquid water drops down by gravitation, the evaporator and the condenser are usually designed in upright. In other words, the gas phase conduit is connected to the top portions of the evaporator and the condenser, and the liquid phase conduit is connected to the bottom portions of the evaporator and the condenser. However, it is difficult in such a configuration to reduce the height of the entire heat dissipation device. The space occupation of the heat dissipation device of the electronic product limits its applications. Moreover, the condenser is usually composed of many pipes, which complicate the manufacturing process of the heat dissipation device, and increase costs of manufacture and materials.

SUMMARY

An aspect of the present invention is to provide a heat dissipation assembly.

According to an embodiment of the present invention, a heat dissipation assembly includes a condenser, an evaporator, a vapor conduit, and a liquid conduit. The condenser has a condensing chamber therein. Two ends of the vapor conduit are respectively connected to the condenser and the evaporator. Two ends of the liquid conduit are respectively connected to the condenser and the evaporator. A geometric center of the liquid conduit in the condensing chamber is lower than or equal to a geometric center of the condensing chamber.

In one embodiment of the present invention, the evaporator has an evaporating chamber, and a geometric center of the liquid conduit in the evaporating chamber is lower than or equal to a geometric center of the evaporating chamber.

In one embodiment of the present invention, the evaporating chamber has a first portion and a second portion that communicates with the first portion, and the first portion is located at an edge of the second portion.

In one embodiment of the present invention, the liquid conduit has a water outlet in the evaporating chamber, and the evaporator includes a liquid working fluid. The water outlet of the liquid conduit is lower than a liquid level of the liquid working fluid.

In one embodiment of the present invention, the water outlet of the liquid conduit rotates along an axis of the liquid conduit.

In one embodiment of the present invention, the water outlet rotates from a horizontal direction to an upward vertical direction in a rotation direction.

In one embodiment of the present invention, the condenser further has two connected oblique surfaces therein.

In one embodiment of the present invention, the two oblique surfaces are located in a bottom portion of the condensing chamber.

In one embodiment of the present invention, an end of the liquid conduit in the condensing chamber is adjacent to a connection position of the two oblique surfaces.

In one embodiment of the present invention, an included angle is included between the two oblique surfaces, and is in a range from 60 degrees to 179 degrees.

In one embodiment of the present invention, the liquid conduit is obliquely connected to the condenser and the evaporator.

In one embodiment of the present invention, an end of the liquid conduit connected to the condenser is higher than or equal to an end of the liquid conduit connected to the evaporator.

In one embodiment of the present invention, an included angle is included between the liquid conduit and the evaporator, and is in a range from 0 degree to 60 degrees.

In one embodiment of the present invention, the condenser further includes a plurality of capillary structures. The capillary structures are located on a surface of the condenser facing the condensing chamber.

In one embodiment of the present invention, the condenser or the evaporator has heat dissipation fins.

In one embodiment of the present invention, the condensing chamber has a recess indenting therefrom, and the first end of the liquid conduit is positioned within the recess.

In one embodiment of the present invention, the first end of the liquid conduit is in contact with the recess.

In one embodiment of the present invention, the condensing chamber has a first oblique surface and a second oblique surface, the recess is between the first and second oblique surfaces, and a length of the first oblique surface is shorter than that of the second oblique surface.

In one embodiment of the present invention, the condensing chamber has a first surface and a second surface, the recess is between the first and second surfaces, and a length of the first surface is shorter than that of the second surface.

In one embodiment of the present invention, the first and second surfaces are parallel to a bottom surface of the condenser.

In one embodiment of the present invention, the first and second surfaces are located in a bottom portion of the condensing chamber.

In the aforementioned embodiment of the present invention, since the geometric center of the liquid conduit in the condensing chamber is lower than or equal to the geometric center of the condensing chamber, a working fluid condensed in the condensing chamber may flow to the liquid conduit due to gravity, such that the liquid working fluid in the condenser is easily gathered by the liquid conduit.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

Figure 1:
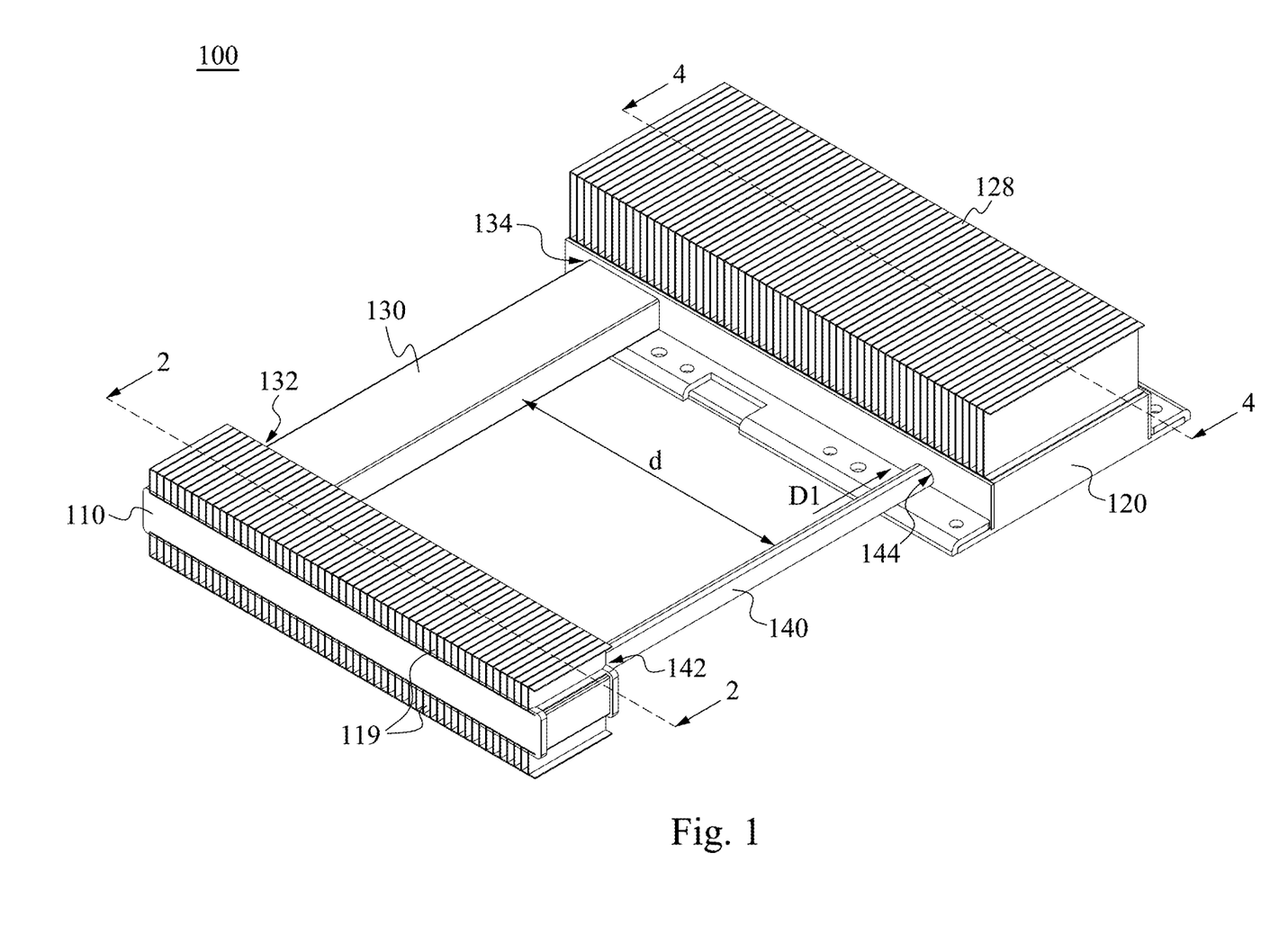
FIG. 1 is a perspective view of a heat dissipation assembly according to one embodiment of the present invention.

FIG. 1 is a perspective view of a heat dissipation assembly 100 according to one embodiment of the present invention. As shown in FIG. 1, the heat dissipation assembly 100 includes a condenser 110, an evaporator 120, a vapor conduit 130, and a liquid conduit 140. Two ends 132, 134 of the vapor conduit 130 are respectively connected to the condenser 110 and the evaporator 120. Two ends 142, 144 of the liquid conduit 140 are respectively connected to the condenser 110 and the evaporator 120, and the liquid conduit 140 is spaced from the vapor conduit 130 at a distance d. In this embodiment, the top view of the condenser 110, the evaporator 120, the vapor conduit 130, and the liquid conduit 140 is quadrilateral, but the present invention is not limited in this regard.

When the heat dissipation assembly 100 is in operation, the evaporator 120 may be disposed on a heat source, and an endothermal element may be disposed between the evaporator 120 and the heat source. The heat of the heat source may be transmitted to liquid working fluid (e.g., water) in the evaporator 120. After the liquid working fluid receives thermal energy, the liquid working fluid may transform into gas working fluid (e.g., water vapor), such that the gas working fluid may be transferred to the condenser 110 through the vapor conduit 130. The condenser 110 may utilize external heat dissipation element (e.g., fins) to take the heat of the gas working fluid away, such that the gas working fluid is condensed into liquid working fluid in the condenser 110. Thereafter, the liquid working fluid condensed in the condenser 110 may return to the evaporator 120 by utilizing the liquid conduit 140. Through aforesaid heat exchange circulation, the heat source may be cooled.

Furthermore, the condenser 110 and the evaporator 120 may respectively have heat dissipation fins 119, 128, but the present invention is not limited in this regard. In this embodiment, the heat dissipation fins 119 are disposed on two flat surfaces of the condenser 110 that are respectively at the top and the bottom of the condenser 110, and the heat dissipation fins 128 are disposed above the evaporator 120.

In the following description, the structure of each of the elements in the heat dissipation assembly 100 will be described.

Figure 2:
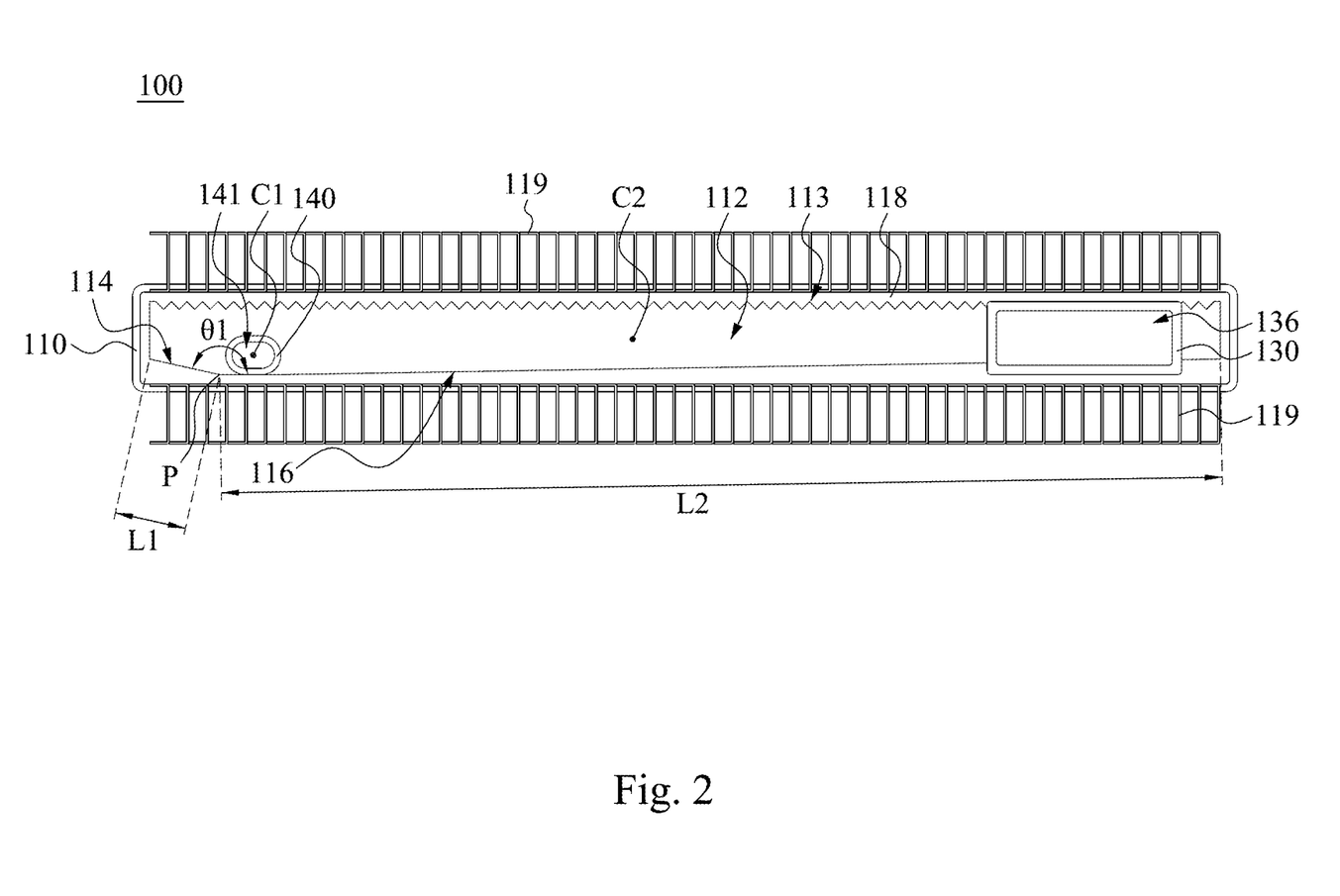
FIG. 2 is a cross-sectional view of the heat dissipation assembly taken along line 2-2 shown in FIG. 1.
Figure 3:
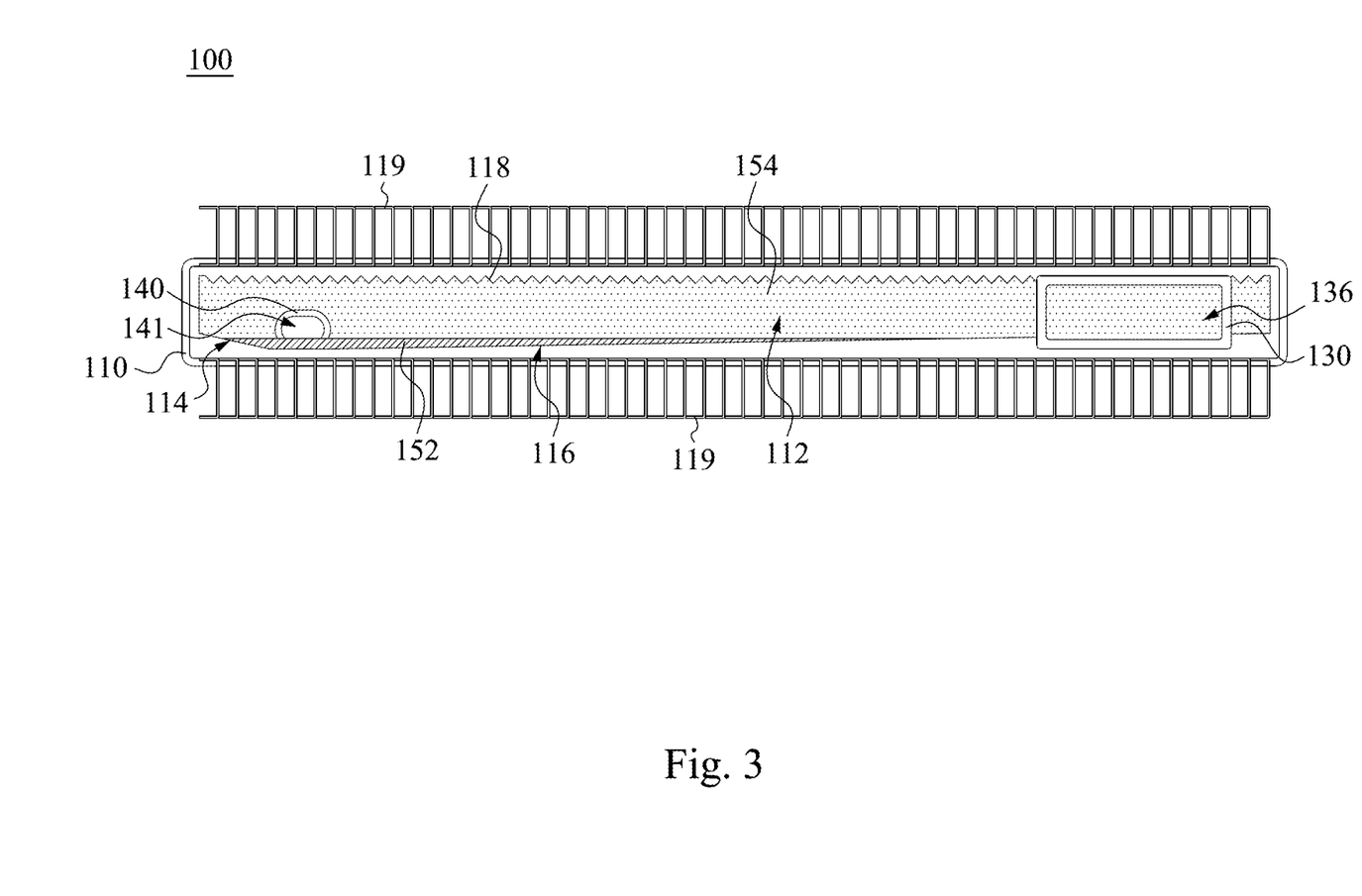
FIG. 3 is a cross-sectional view of the heat dissipation assembly shown in FIG. 2, in which the heat dissipation assembly is in an operation state.

FIG. 2 is a cross-sectional view of the heat dissipation assembly 100 taken along line 2-2 shown in FIG. 1. FIG. 3 is a cross-sectional view of the heat dissipation assembly 100 shown in FIG. 2, in which the heat dissipation assembly 100 is in an operation state. As shown in FIG. 2 and FIG. 3, the condenser 110 has a condensing chamber 112 therein. The geometric center C1 of an end of the liquid conduit 140 in the condensing chamber 112 is lower than or equal to the geometric center C2 of the condensing chamber 112. After a gas working fluid 154 enters the condensing chamber 112 of the condenser 110 from the air outlet 136 of the vapor conduit 130, the condenser 110 may utilize the heat dissipation fins 119 to take the heat of the gas working fluid 154 away, such that the gas working fluid 154 is condensed into liquid working fluid 152 in the condensing chamber 112. Through the configuration that the geometric center C1 of the liquid conduit 140 is lower than or equal to the geometric center C2 of the condensing chamber 112, the liquid working fluid 152 condensed in the condensing chamber 112 may flow to the liquid conduit 140 due to gravity, such that the liquid working fluid 152 in the condenser 110 is easily gathered by the liquid conduit 140.

In this embodiment, the condenser 110 further has two connected oblique surfaces 114, 116 therein, and the two oblique surfaces 114, 116 are located in the bottom portion of the condensing chamber 112. The liquid conduit 140 in the condensing chamber 112 is adjacent to the connection position P of the two oblique surfaces 114, 116. It is to be noted that the connection position P in the embodiment may be a point or a curved line, and the present invention is not limited in this regard, the type pf the connection position P may be determined as deemed necessary by designers.

After the gas working fluid 154 is condensed into the liquid working fluid 152 in the condensing chamber 112, since the liquid conduit 140 in the condensing chamber 112 is adjacent to the connection position P of the two oblique surfaces 114, 116, the liquid working fluid 152 condensed in the condensing chamber 112 may flow to the water inlet 141 of the liquid conduit 140 along the two oblique surfaces 114, 116 that are at two sides of the liquid conduit 140 due to gravity, and the configuration of the two oblique surfaces 114, 116 decreases the flow dead corners of the condensing chamber 112 and prevents the liquid working fluid 152 from collecting in the bottom portion of the condensing chamber 112 of the condenser 110, especially adjacent to the corners of the condensing chamber 112.

For example, after the gas working fluid 154 is condensed in the condensing chamber 112 that is at the right side of the liquid conduit 140, the liquid working fluid 152 formed at the right side of the liquid conduit 140 may be guided to the liquid conduit 140 by the oblique surface 116 that is at the right side of the liquid conduit 140 due to gravity; after the gas working fluid 154 is condensed in the condensing chamber 112 that is at the left side of the liquid conduit 140, the liquid working fluid 152 formed at the left side of the liquid conduit 140 may be also guided to the liquid conduit 140 by the oblique surface 114 that is at the left side of the liquid conduit 140 due to gravity.

In this embodiment, an included angle 81 is included between the two oblique surfaces 114, 116, and the included angle 81 is in a range from 60 degrees to 179 degrees, which is a convenient factor for the liquid working fluid 152 at the two sides to flow toward the liquid conduit 140. Furthermore, the length L2 of the oblique surface 116 is greater than the length L1 of the oblique surface 114, and the oblique surface 116 having the longer length L2 is located between the vapor conduit 130 and the liquid conduit 140 in the condensing chamber 112. In other words, a distance between the oblique surface 114 that has the shorter length L1 and the liquid conduit 140 in the condensing chamber 112 is smaller than a distance between the oblique surface 114 that has the shorter length L1 and the vapor conduit 130 in the condensing chamber 112. As a result of such configuration, before the gas working fluid 154 arrives at the liquid conduit 140, most of the gas working fluid 154 may be condensed into the liquid working fluid 152, and flows to the liquid conduit 140 along the oblique surface 116. Moreover, few of the gas working fluid 154 may be condensed into the liquid working fluid 152 at the left side of the liquid conduit 140, and flows to the liquid conduit 140 along the oblique surface 114.

In addition, the condenser 110 may further include a plurality of capillary structures 118. The capillary structures 118 are located on a surface 113 of the condenser 110 facing the condensing chamber 112. The gas working fluid 154 may be easily gathered and condensed through the capillary structures 118, such that thermal efficiency is improved to speed up the formation rate of the liquid working fluid 152. In this embodiment, the capillary structures 118 are located on the surface 113 of the top portion of the condenser 110, but the present invention is not limited in this regard. The capillary structures 118 may be also selectively disposed on the sidewall surface of the condenser 110, the oblique surface 114, and the oblique surface 116 as deem necessary by designers.

Figure 4:
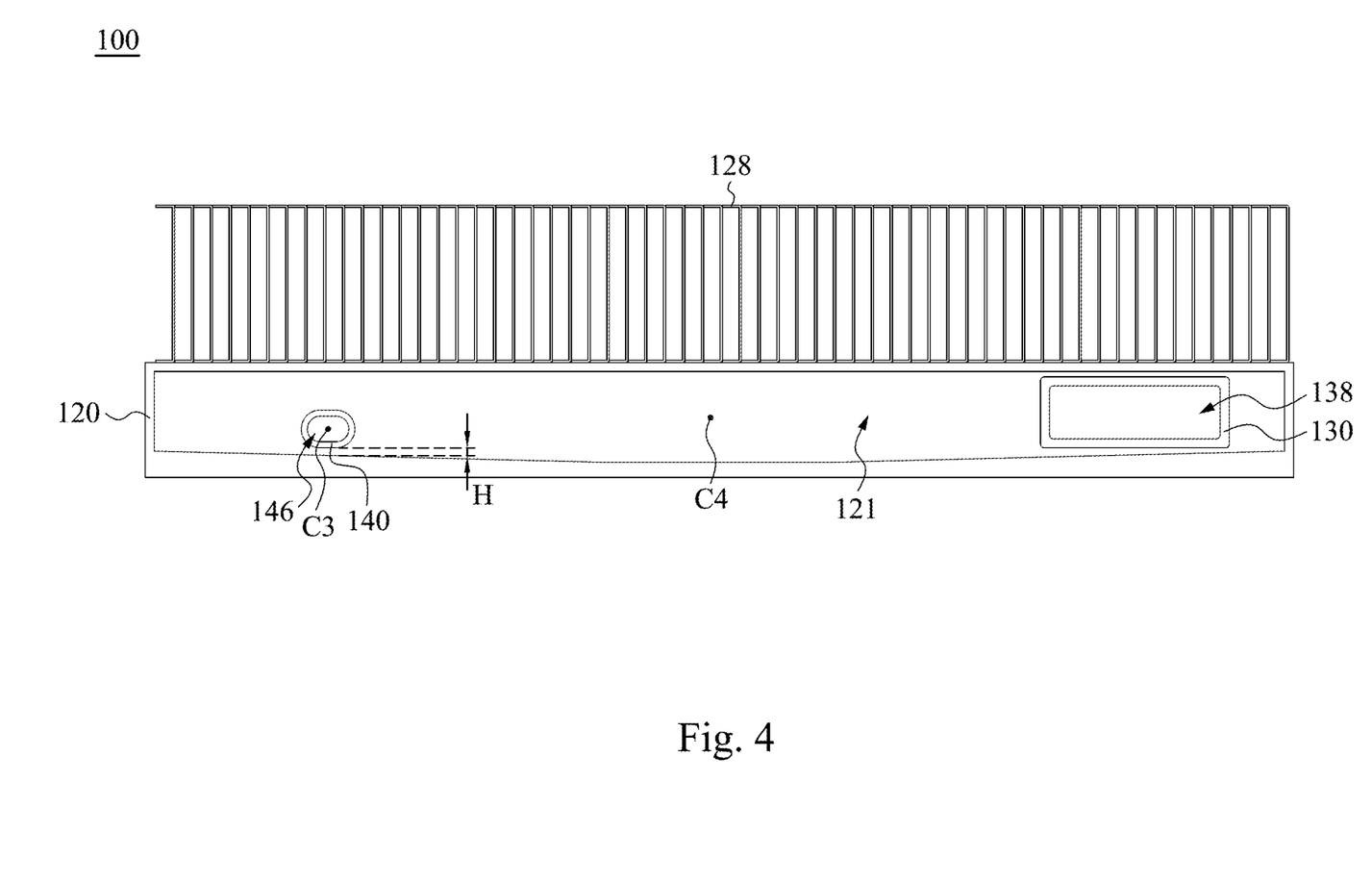
FIG. 4 is a cross-sectional view of the heat dissipation assembly taken along line 4-4 shown in FIG. 1.
Figure 5:
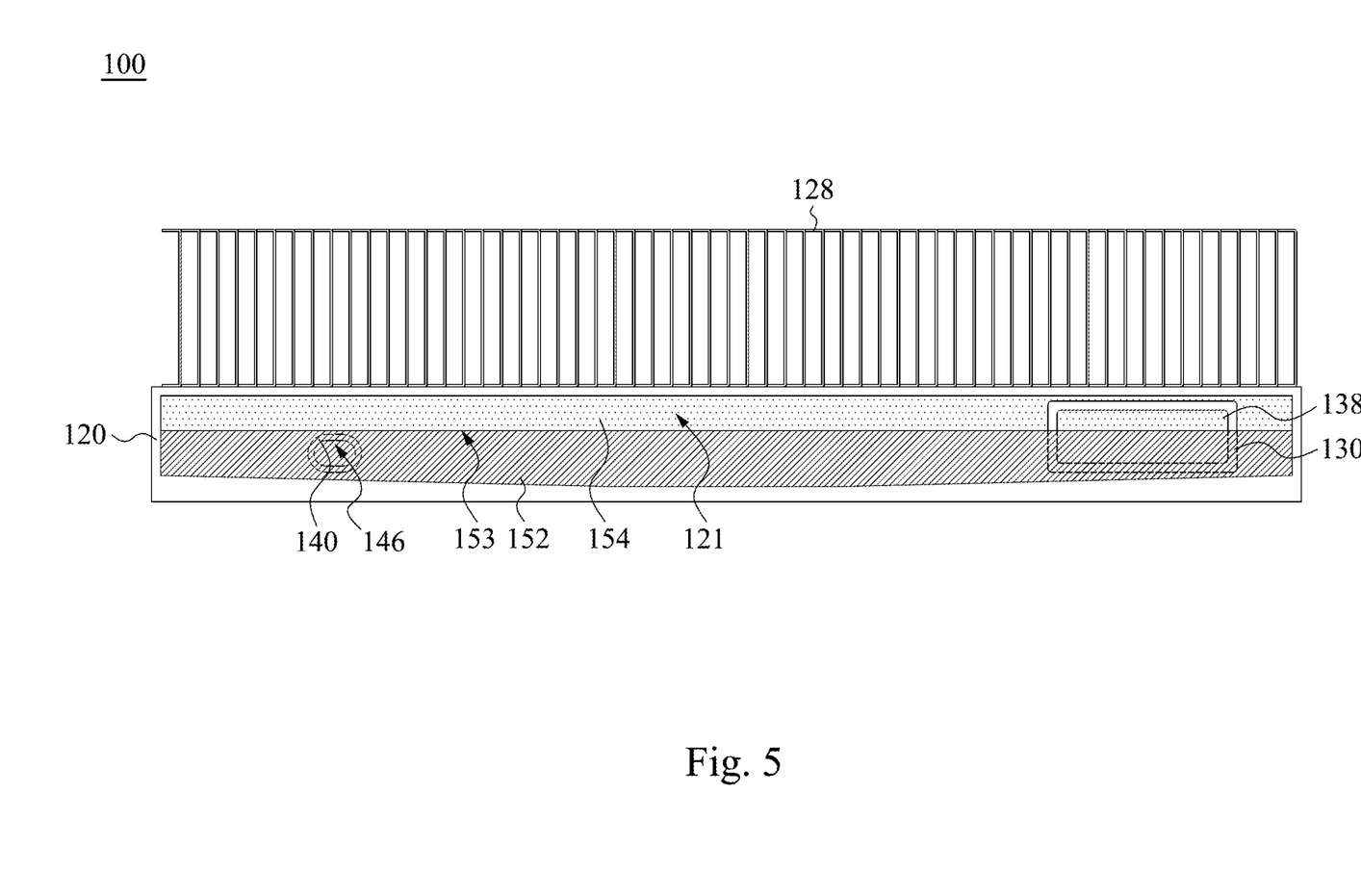
FIG. 5 is a cross-sectional view of the heat dissipation assembly shown in FIG. 4, in which the heat dissipation assembly is in an operation state.

FIG. 4 is a cross-sectional view of the heat dissipation assembly 100 taken along line 4-4 shown in FIG. 1. FIG. 5 is a cross-sectional view of the heat dissipation assembly 100 shown in FIG. 4, in which the heat dissipation assembly 100 is in an operation state. As shown in FIG. 4 and FIG. 5, the evaporator 120 has an evaporating chamber 121, and the evaporating chamber 121 communicates with the vapor conduit 130 and the liquid conduit 140. Furthermore, the geometric center C3 of an end of the liquid conduit 140 in the evaporating chamber 121 is lower than or equal to the geometric center C4 of the evaporating chamber 121. The liquid conduit 140 has a water outlet 146 in the evaporating chamber 121, and the level H of the water outlet 146 of the liquid conduit 140 is lower than a liquid level 153 of the liquid working fluid 152. As a result of such a design, the evaporator 120 may utilize the adjusted level H of the water outlet 146 of the liquid conduit 140 to control the liquid level 153 of the liquid working fluid 152, such that a portion of space in the evaporating chamber 121 is reserved for the diffusion of the gas working fluid 154, thereby preventing the flow paths of the gas working fluid 154 and the liquid working fluid 152 from interfering with each other to reduce thermal efficiency.

After the liquid working fluid 152 in the evaporator 120 receives thermal energy of a heat source, the liquid working fluid 152 may transform into the gas working fluid 154 that can rise to the top half of the evaporating chamber 121. Thereafter, the gas working fluid 154 diffuses to enter the gas inlet 138 of the vapor conduit 130 due to pressure. In other words, the top half of the evaporating chamber 121 is temporary diffusion space for the gas working fluid 154, and such liquid-gas separating design at the upper layer and the lower layer of the evaporating chamber 121 can prevent the flow paths of the gas working fluid 154 and the liquid working fluid 152 from interfering with each other in the evaporator 120.

In addition, in this embodiment, the direction of the water outlet 146 of the liquid conduit 140 is the axis direction of the liquid conduit 140, as shown in the direction D1 of FIG. 1. However, the present invention is not limited to the direction of the water outlet 146 of the liquid conduit 140.

It is to be noted that the connection relationships of the aforementioned elements will not be repeated in the following description. In the following description, other types of liquid conduits and evaporators of heat dissipation assemblies will be described.

Figure 6:
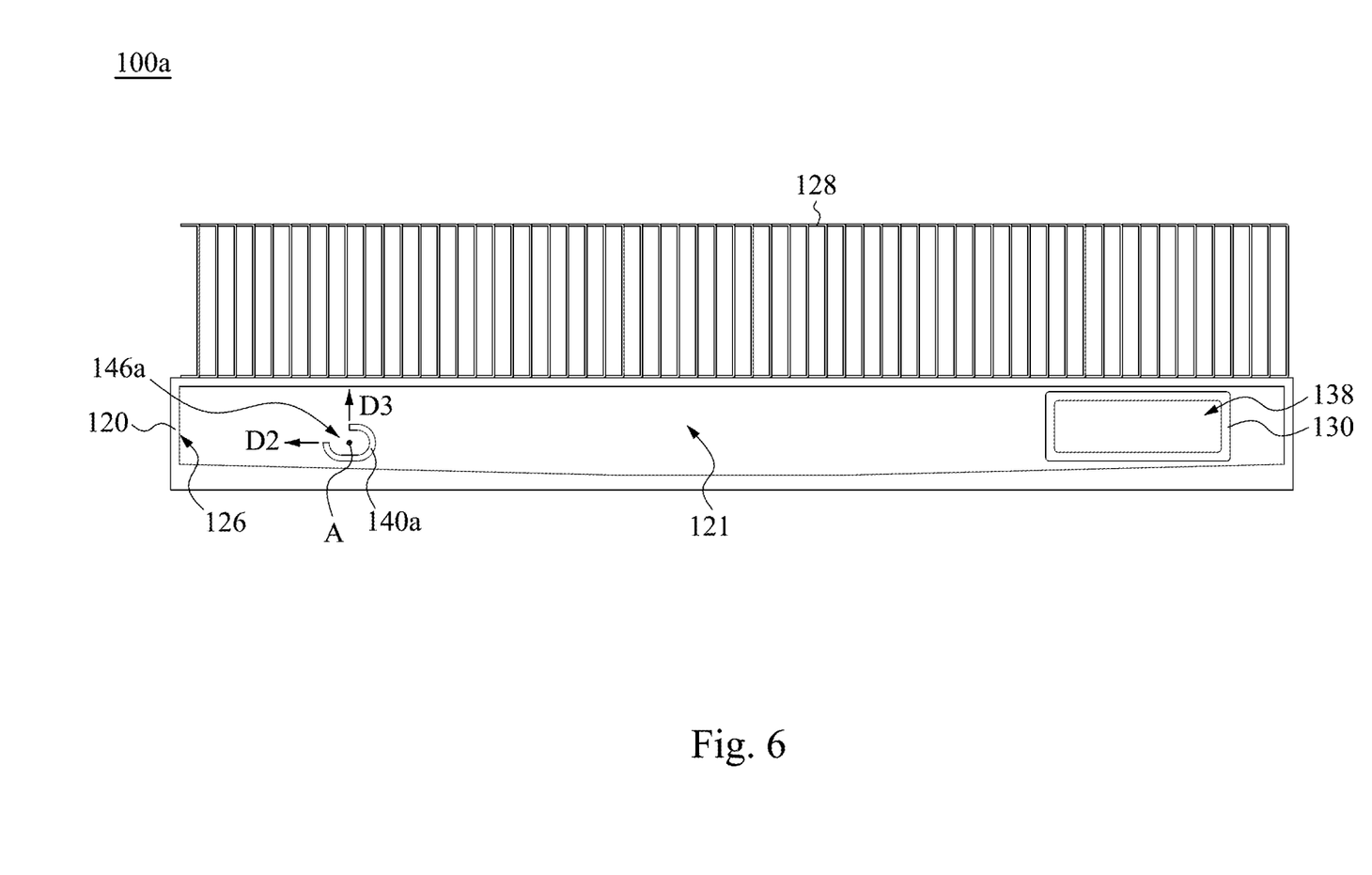
FIG. 6 is a perspective view of a heat dissipation assembly according to another embodiment of the present invention, in which the position of the cut line is the same that of FIG. 4.

FIG. 6 is a perspective view of a heat dissipation assembly 100a according to another embodiment of the present invention, in which the position of the cut line is the same that of FIG. 4. The heat dissipation assembly 100a includes the condenser 110 (see FIG. 1), the evaporator 120, the vapor conduit 130, and a liquid conduit 140a. The difference between this embodiment and the embodiment shown in FIG. 4 is that the water outlet 146a of the liquid conduit 140a rotates along the axis A of the liquid conduit 140a. In this embodiment, the water outlet 146a rotates from a horizontal direction D2 to an upward vertical direction D3 in a rotation direction. For example, the water outlet 146a has an opening range of 45 degrees, as shown in FIG. 6.

That is to say, the direction of the water outlet 146a of the liquid conduit 140a is the radial direction of the liquid conduit 140a. Through the configuration of the water outlet 146a of the liquid conduit 140a shown in FIG. 6, the liquid working fluid 152 (see FIG. 5) may flow out of the liquid conduit 140a away from and back on to a heat-source side when the liquid working fluid 152 flows into the evaporating chamber 121 from the liquid conduit 140a, thereby preventing the liquid conduit 140a from interfering with the newly formed gas working fluid 154 (see FIG. 5) that may cause the liquid working fluid 152 cannot flow to the heat-source side. For example, the liquid working fluid 152 flows out of the liquid conduit 140a toward the sidewall 126 of the evaporator 120. Hence, the water outlet 146a may further prevent the flow paths of the gas working fluid 154 and the liquid working fluid 152 from interfering with each other in the evaporator 120.

Figure 7:
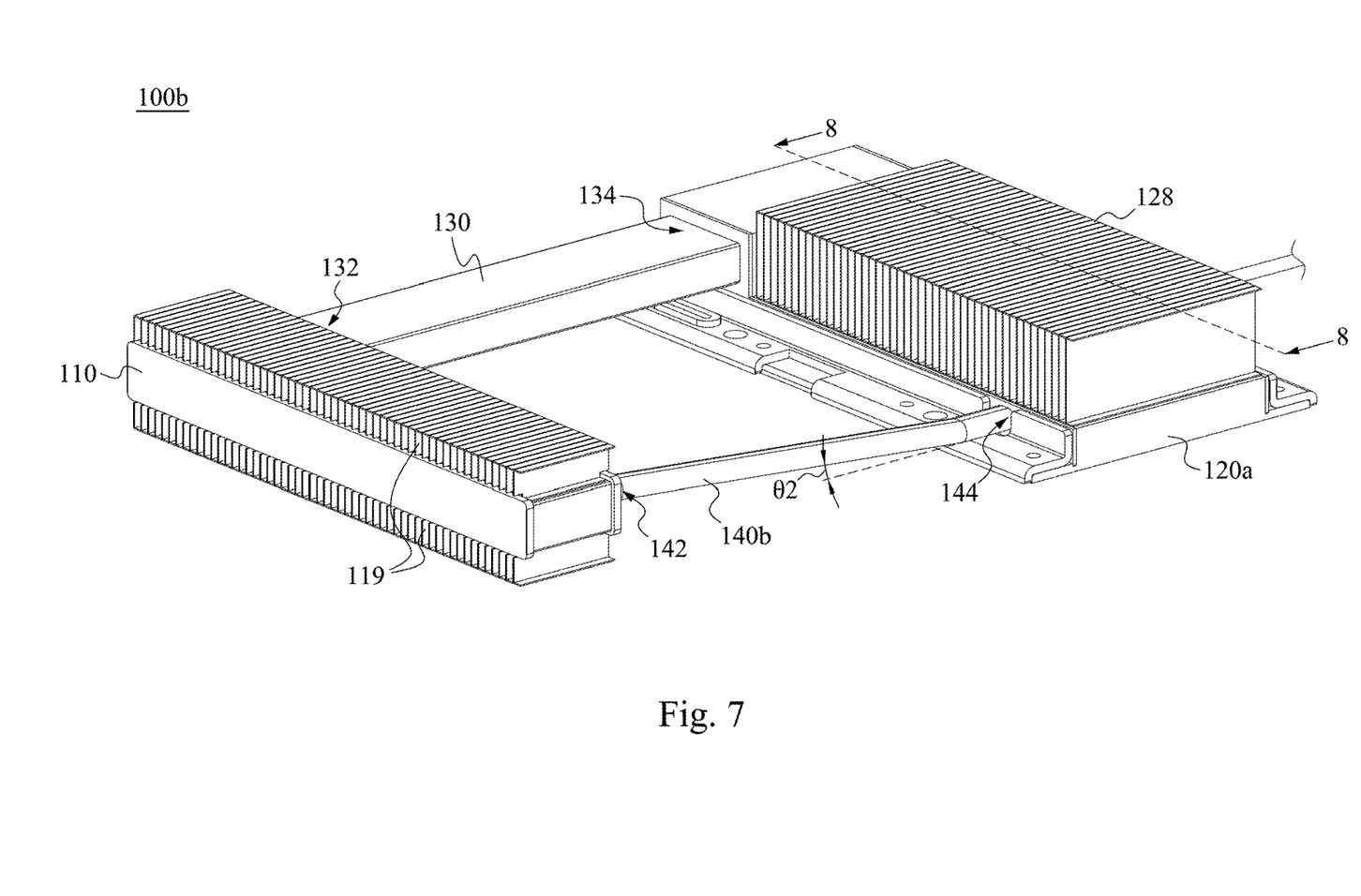
FIG. 7 is a perspective view of a heat dissipation assembly according to another embodiment of the present invention.

FIG. 7 is a perspective view of a heat dissipation assembly 100b according to another embodiment of the present invention. The heat dissipation assembly 100b includes the condenser 110, an evaporator 120a, the vapor conduit 130, and a liquid conduit 140b. The difference between this embodiment and the embodiment shown in FIG. 1 is that the liquid conduit 140b is obliquely connected to the condenser 110 and the evaporator 120a, and the end 142 of the liquid conduit 140b connected to the condenser 110 is higher than the end 144 of the liquid conduit 140b connected to the evaporator 120a. As a result, due to the height difference of the liquid conduit 140b, the flow speed of the liquid working fluid 152 (see FIG. 3) that flows into the liquid conduit 140b from the condenser 110 toward the evaporator 120a may be improved, thereby improving transferring effect. In this embodiment, an included angle 82 included between the liquid conduit 140b that is between the condenser 110 and the evaporator 120a and a horizontal level is in a range from 0 degree to 60 degrees. In other words, the included angle 82 is included between the liquid conduit 140b and the evaporator 120a.

Moreover, in the embodiments shown in FIGS. 1 and 7, the vapor conduit 130 is substantially horizontal, but in another embodiment, the vapor conduit 130 may be designed as the liquid conduit 140b in an oblique arrangement. In other words, the end 132 of the vapor conduit 130 connected to the condenser 110 may be higher than the end 134 of the vapor conduit 130 connected to the evaporator 120a, such that the gas working fluid 154 (see FIG. 3) formed in the evaporator 120a may easily rise into the condenser 110 through the liquid vapor conduit 130.

Figure 8:
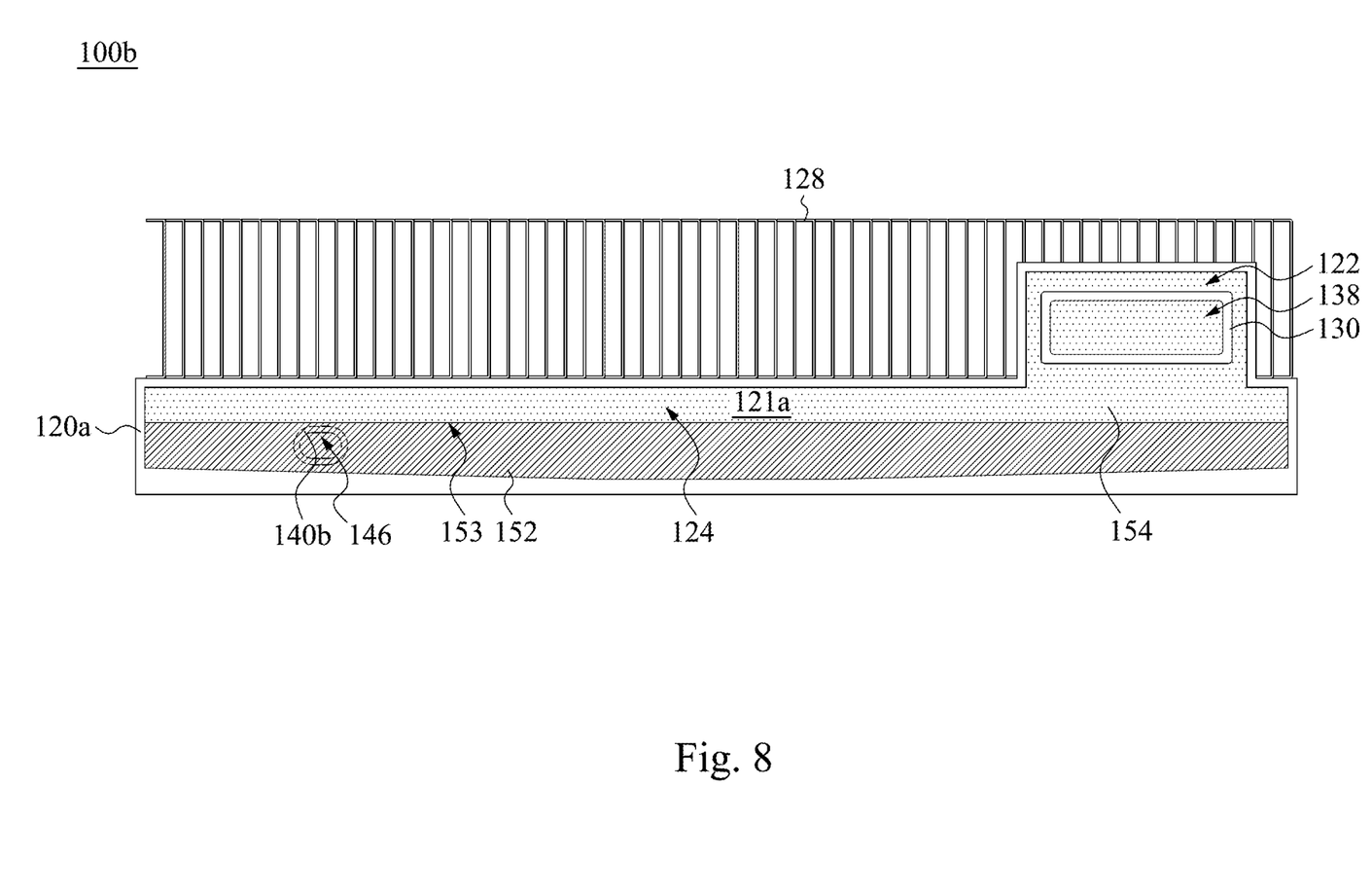
FIG. 8 is a cross-sectional view of the heat dissipation assembly taken along line 8-8 shown in FIG. 7, in which the heat dissipation assembly is in an operation state.

FIG. 8 is a cross-sectional view of the heat dissipation assembly 100 taken along line 8-8 shown in FIG. 7, in which the heat dissipation assembly is in an operation state. The difference between this embodiment and the embodiment shown in FIG. 5 is that an evaporating chamber 121a has a first portion 122 and a second portion 124 that communicates with the first portion 122, and the first portion 122 is substantially located at an edge of the second portion 124. Hence, the combination of the first and second portions 122, 124 is substantially L-shaped, but the present invention is not limited in this regard. The vapor conduit 130 is connected to the first portion 122 of the evaporating chamber 121a, and the liquid conduit 140b is connected to the second portion 124 of the evaporating chamber 121a. As a result, the liquid level 153 of the liquid working fluid 152 in the evaporator 120a may be controlled by the level of the liquid conduit 140b in the second portion 124 of the evaporating chamber 121a, thereby ensuring that the liquid working fluid 152 in the evaporator 120a is accommodated in the second portion 124 of the evaporating chamber 121a and does not occupy the space of the first portion 122 of the evaporating chamber 121a, and further ensuring liquid-gas separating effect.

After the liquid working fluid 152 in the evaporator 120a receives thermal energy of a heat source, the liquid working fluid 152 may transform into the gas working fluid 154 that can rise to the first portion 122 of the evaporating chamber 121a. Thereafter, the gas working fluid 154 diffuses to enter the gas inlet 138 of the vapor conduit 130 due to pressure. In other words, the first portion 122 of the evaporating chamber 121a is temporary diffusion space for the gas working fluid 154, and can prevent the flow paths of the gas working fluid 154 and the liquid working fluid 152 from interfering with each other in the evaporator 120a.

It is to be noted that the connection relationships of the aforementioned elements will not be repeated in the following description. In addition, elements with the same element numbers can be regarded as being substantially identical. In the following description, other types of condensers of heat dissipation assemblies will be described.

Figure 9:
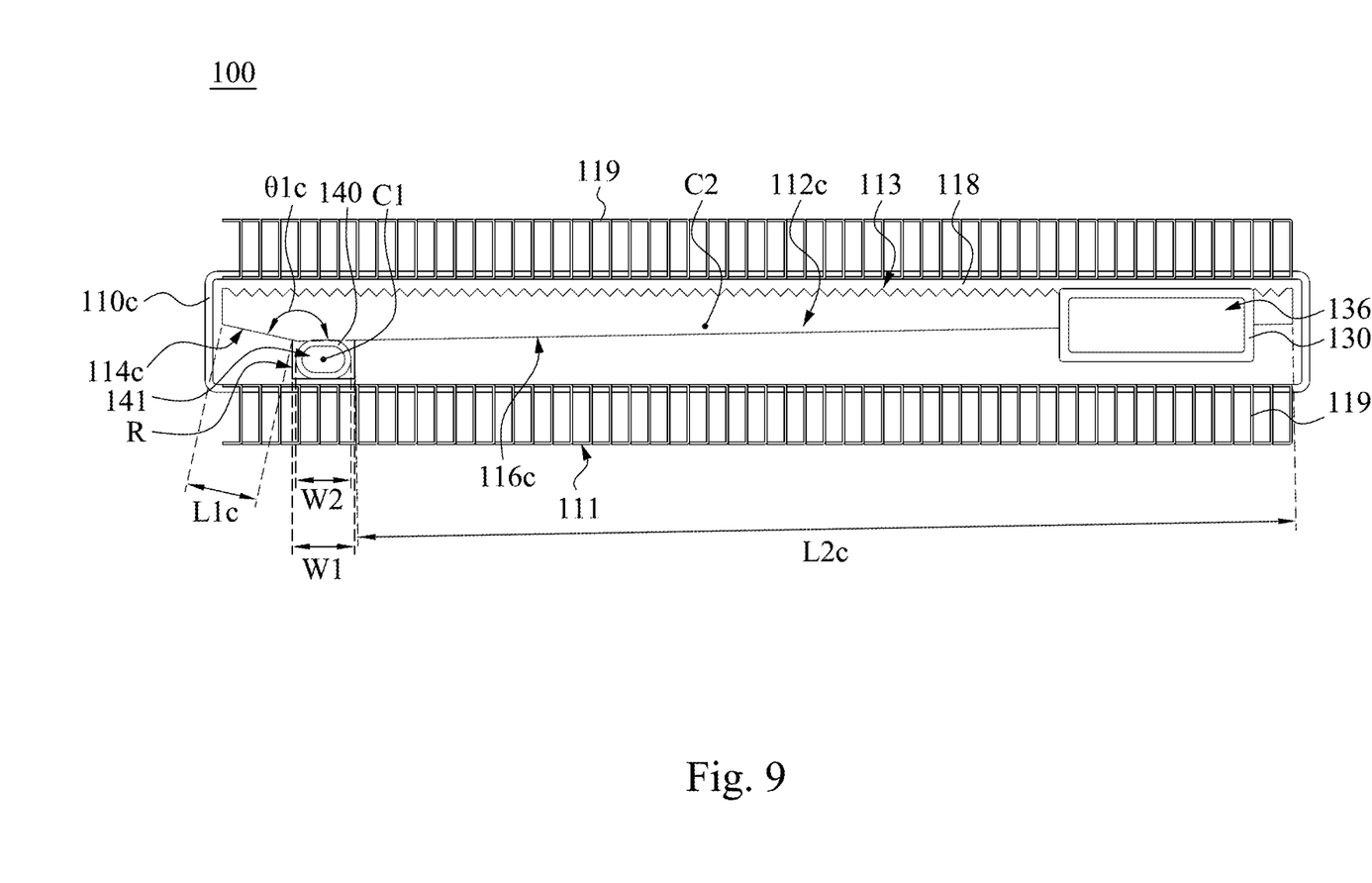
FIG. 9 is a cross-sectional view of a heat dissipation assembly according to another embodiment of the present invention, in which the position of the cut line is the same as that of FIG. 2.

FIG. 9 is a cross-sectional view of a heat dissipation assembly 100 according to another embodiment of the present invention, in which the position of the cut line is the same as that of FIG. 2. Reference is made to FIG. 1 and FIG. 9. The heat dissipation assembly 100 includes the condenser 110c, the evaporator 120, the vapor conduit 130, and the liquid conduit 140. The difference between this embodiment and the embodiment shown in FIG. 2 is that the condensing chamber 112c has a recess R indenting from a bottom portion thereof and located between the first oblique surface 114c and the second oblique surface 116c. Additionally, the water inlet 141 of the liquid conduit 140 (i.e., an end of the liquid conduit 140 in the condensing chamber 112c) is positioned within the recess R. In this embodiment, since the water inlet 141 of the liquid conduit 140 is positioned within the recess R indenting from a bottom portion of the condensing chamber 112c, the geometric center C1 of the end of the liquid conduit 140 in the condensing chamber 112c is lower than the geometric center C2 of the condensing chamber 112c. In some embodiments, the water inlet 141 of the liquid conduit 140 is further in contact with a bottom surface of the recess R, as shown in FIG. 9.

In this embodiment, after the gas working fluid is condensed into the liquid working fluid in the condensing chamber 112c, the liquid working fluid may flow along the first oblique surface 114c and the second oblique surface 116c and drop into the recess R to reach the water inlet 141 due to gravity. Since the water inlet 141 is in the recess R indenting from the bottom portion of the condensing chamber 112c, the liquid working fluid flowing along the first oblique surface 114c tends to drop into the recess R to reach the water inlet 141 instead of passing through the water inlet 141 to reach the second oblique surface 116c, and the liquid working fluid flowing along the second oblique surface 116c tends to drop into the recess R to reach the water inlet 141 instead of passing through the water inlet 141 to reach the first oblique surface 114c. Accordingly, the cooling efficiency can be improved and thus the cooling circulation of the heat dissipation assembly 100 can be enhanced.

In this embodiment, an included angle θ1c is included between the first oblique surface 114c and the second oblique surface 116c, and the included angle θ1c is in a range from 60 degrees to 179 degrees, which is a convenient factor for the liquid working fluid on the first oblique surface 114c and the second oblique surface 116c to flow toward the water inlet 141 of the liquid conduit. Furthermore, a length L2c of the second oblique surface 116c is greater than a length L1c of the first oblique surface 114c, and the second oblique surface 116c having the greater length L2c is located between the vapor conduit 130 and the liquid conduit 140 in the condensing chamber 112c. As a result of such configuration, before the gas working fluid reaches the water inlet 141 of the liquid conduit 140, most of the gas working fluid may be condensed into the liquid working fluid and flows to the water inlet 141 along the second oblique surface 116c.

In this embodiment, a width W1 of the recess R is substantially equal to or larger than a width W2 of the water inlet 141. Accordingly, the water inlet 141 can be totally positioned within the recess R, such that as long as the liquid working fluid drops into the recess R, almost all of the liquid working fluid can flow into the water inlet 141 of the liquid conduit 140. In this embodiment, the recess R is a rectangular shape. Such a shape gives convenience for the manufacturing of the condenser 110c. However, the present disclosure is not limited in this regard. In other embodiments, the recess R can be in a shape of circle, oval, parallelogram, trapezoid or combinations thereof.

Figure 10:
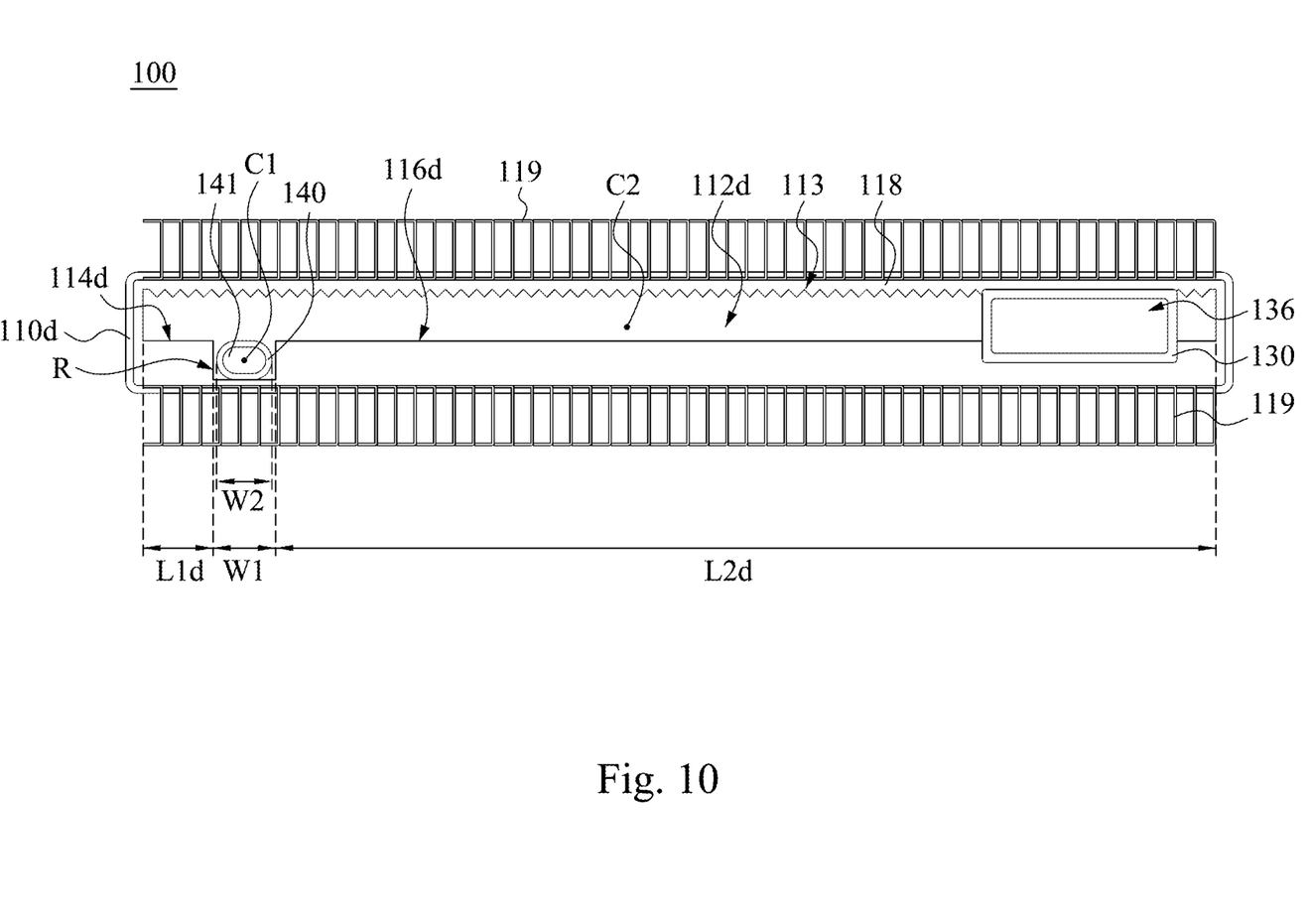
FIG. 10 is a cross-sectional view of a heat dissipation assembly according to another embodiment of the present invention, in which the position of the cut line is the same as that of FIG. 2.

FIG. 10 is a cross-sectional view of a heat dissipation assembly 100 according to another embodiment of the present invention, in which the position of the cut line is the same as that of FIG. 2. Reference is made to FIG. 1 and FIG. 10. The heat dissipation assembly 100 includes the condenser 110d, the evaporator 120, the vapor conduit 130, and the liquid conduit 140. The difference between this embodiment and the embodiment shown in FIG. 9 is that the condenser 110d includes a first surface 114d and a second surface 116d which are not in an oblique configuration in a bottom portion of the condenser 110d. In other words, the first oblique surface 114c and the second oblique surface 116c in FIG. 9 are substituted with the first surface 114d and the second surface 116d to form the condenser 110d shown in FIG. 10. In this embodiment, the first surface 114d and the second surface 116d are parallel to each other and are further parallel to a bottom surface 111 of the condenser 110. In some embodiments, the first surface 114d and the second surface 116d may also be parallel to an extending direction of the capillary structures 118. In addition, the first surface 114d and the second surface 116d can be at a same height.

In this embodiment, a length L2d of the second surface 116d is greater than a length L1d of the first surface 114d, and the second surface 116d having the greater length L2d is located between the vapor conduit 130 and the liquid conduit 140 in the condensing chamber 112d. As a result of such configuration, before the gas working fluid reaches the water inlet 141 of the liquid conduit 140, most of the gas working fluid may be condensed into the liquid working fluid and flows to the water inlet 141 along the second surface 116d.

According to the aforementioned embodiments of the present disclosure, since the geometric center of the liquid conduit in the condensing chamber is lower than or equal to the geometric center of the condensing chamber, a working fluid condensed in the condensing chamber may flow to the liquid conduit due to gravity, such that the liquid working fluid in the condenser is easily gathered by the liquid conduit.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims.

What is claimed is:

1. A heat dissipation assembly, comprising:
   a condenser having a condensing chamber, a first oblique surface and a second oblique surface therein, wherein the first oblique surface is between a sidewall of the condensing chamber and the second oblique surface, and a length of the first oblique surface is shorter than a length of the second oblique surface;
   an evaporator;
   a vapor conduit, wherein a first end of the vapor conduit is connected to the condenser, and a second end of the vapor conduit is connected to the evaporator; and
   a liquid conduit, wherein a first end of the liquid conduit is connected to the condenser, and a second end of the liquid conduit is connected to the evaporator,
   wherein a geometric center of the liquid conduit in the condensing chamber is lower than a geometric center of the condensing chamber, the second oblique surface is located between the first end of the vapor conduit in the condensing chamber and the first end of the liquid conduit in the condensing chamber, and the first end of the liquid conduit in the condensing chamber is on the second oblique surface;
   wherein the first and second oblique surfaces meet in the condensing chamber at a first position which is between the sidewall and the geometric center of the condensing chamber; and
   wherein the first end of the liquid conduit is located at a second position which is between the first position and the geometric center and which is closer to the sidewall than to the geometric center.

2. The heat dissipation assembly of claim 1, wherein the evaporator has an evaporating chamber, and a geometric center of the liquid conduit in the evaporating chamber is lower than or equal to a geometric center of the evaporating chamber.

3. The heat dissipation assembly of claim 2, wherein the evaporating chamber has a first portion and a second portion that communicates with the first portion, and the first portion is located at an edge of the second portion.

4. The heat dissipation assembly of claim 2, wherein the liquid conduit has a water outlet in the evaporating chamber, and the evaporator comprises:
   a liquid working fluid, wherein the water outlet of the liquid conduit is lower than a liquid level of the liquid working fluid.

5. The heat dissipation assembly of claim 4, wherein the water outlet of the liquid conduit rotates along an axis of the liquid conduit.

6. The heat dissipation assembly of claim 1, wherein the first oblique surface and the second oblique surface are located in a bottom portion of the condensing chamber.

7. The heat dissipation assembly of claim 1, wherein the first end of the liquid conduit is adjacent to the first position.

8. The heat dissipation assembly of claim 1, wherein an included angle is included between the first oblique surface and the second oblique surface, and is in a range from 60 degrees to 179 degrees.

9. The heat dissipation assembly of claim 1, wherein the condenser further comprises:
   a plurality of capillary structures located on a surface of the condenser facing the condensing chamber.

10. The heat dissipation assembly of claim 1, wherein the condenser or the evaporator has heat dissipation fins.

* * * * *